United States Patent
Jung et al.

(10) Patent No.: US 9,875,788 B2
(45) Date of Patent: Jan. 23, 2018

(54) LOW-POWER 5T SRAM WITH IMPROVED STABILITY AND REDUCED BITCELL SIZE

(75) Inventors: Seong-Ook Jung, Seoul (KR); Hyunkook Park, Seoul (KR); Seung-Chul Song, Austin, TX (US); Mohamed Hassan Abu-Rahma, San Diego, CA (US); Lixin Ge, San Diego, CA (US); Zhongze Wang, San Diego, CA (US); Beom-Mo Han, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 218 days.

(21) Appl. No.: 12/731,668

(22) Filed: Mar. 25, 2010

(65) Prior Publication Data

US 2011/0235406 A1 Sep. 29, 2011

(51) Int. Cl.
*G11C 11/412* (2006.01)
(52) U.S. Cl.
CPC .................................. *G11C 11/412* (2013.01)
(58) Field of Classification Search
USPC .......... 365/154, 182, 156, 189.09, 226, 227, 365/228, 229, 205, 207, 208; 326/10, 326/103; 257/66
See application file for complete search history.

(56) References Cited

U.S. PATENT DOCUMENTS

| | | | |
|---|---|---|---|
| 5,289,432 A | 2/1994 | Dhong et al. | |
| 5,315,545 A | 5/1994 | Guo et al. | |
| 5,640,344 A * | 6/1997 | Pani et al. | 365/182 |
| 5,936,911 A * | 8/1999 | Inaba | G11C 8/08 365/154 |
| 5,986,923 A * | 11/1999 | Zhang | G11C 11/412 365/154 |
| 6,205,049 B1 * | 3/2001 | Lien | G11C 11/412 365/154 |
| 6,205,071 B1 * | 3/2001 | Ooishi | 365/207 |

(Continued)

FOREIGN PATENT DOCUMENTS

| | | |
|---|---|---|
| JP | H05166375 A | 7/1993 |
| JP | H0689581 A | 3/1994 |

(Continued)

OTHER PUBLICATIONS

Chandra et al., U.S. Patent Application Publication US 2011/0085391 A1 (U.S. Appl. No. 12/591,127).*

(Continued)

*Primary Examiner* — Vu Le
*Assistant Examiner* — Sung Cho
(74) *Attorney, Agent, or Firm* — Muncy, Geissler, Olds & Lowe (57) ABSTRACT

A 5 Transistor Static Random Access Memory (5T SRAM) is designed for reduced cell size and immunity to process variation. The 5T SRAM includes a storage element for storing data, wherein the storage element is coupled to a first voltage and a ground voltage. The storage element can include symmetrically sized cross-coupled inverters. A single access transistor controls read and write operations on the storage element. Control logic is configured to generate a value of the first voltage a write operation that is different from the value of the first voltage for a read operation.

26 Claims, 9 Drawing Sheets

(56) References Cited

U.S. PATENT DOCUMENTS

| | | | | |
|---|---|---|---|---|
| 6,731,564 B1 * | | 5/2004 | Tran | G11C 7/12 365/203 |
| 6,781,870 B1 * | | 8/2004 | Kushida | G11C 11/412 365/154 |
| 6,795,332 B2 * | | 9/2004 | Yamaoka et al. | 365/154 |
| 6,888,202 B2 * | | 5/2005 | Kang et al. | 365/154 |
| 6,898,111 B2 * | | 5/2005 | Yamauchi | 365/154 |
| 6,998,722 B2 * | | 2/2006 | Madurawe | 257/66 |
| 7,027,346 B2 * | | 4/2006 | Houston et al. | 365/229 |
| 7,164,596 B1 * | | 1/2007 | Deng | G11C 11/417 365/154 |
| 7,269,055 B2 * | | 9/2007 | Lin | G11C 11/417 365/154 |
| 7,292,495 B1 * | | 11/2007 | Kenkare | G11O 5/147 365/203 |
| 7,359,272 B2 * | | 4/2008 | Wang | G11C 8/08 365/226 |
| 7,404,154 B1 * | | 7/2008 | Venkatraman | H01L 27/0207 326/103 |
| 7,466,581 B2 * | | 12/2008 | Huang et al. | 365/154 |
| 7,502,275 B2 * | | 3/2009 | Nii et al. | 365/226 |
| 7,525,834 B2 * | | 4/2009 | Sohn | 365/154 |
| 7,564,725 B2 * | | 7/2009 | Houston | 365/226 |
| 7,596,012 B1 * | | 9/2009 | Su | G11C 7/22 365/154 |
| 7,609,541 B2 | | 10/2009 | Burnett et al. | |
| 7,612,577 B2 * | | 11/2009 | Rashed et al. | 326/10 |
| 7,619,947 B2 * | | 11/2009 | Houston | 365/229 |
| 7,681,628 B2 * | | 3/2010 | Joshi | G11C 11/412 165/154 |
| 7,907,456 B2 * | | 3/2011 | Houston et al. | 365/154 |
| 7,924,604 B2 * | | 4/2011 | Yang et al. | 365/154 |
| 8,009,500 B2 * | | 8/2011 | Nii et al. | 365/226 |
| 8,059,482 B2 * | | 11/2011 | Russell et al. | 365/226 |
| 8,149,612 B1 * | | 4/2012 | de Jong | 365/154 |
| 2004/0125681 A1 | | 7/2004 | Yamaoka et al. | |
| 2006/0262628 A1 * | | 11/2006 | Nii | G11O 5/063 365/226 |
| 2007/0242497 A1 * | | 10/2007 | Joshi | G11C 11/412 365/154 |
| 2009/0109764 A1 * | | 4/2009 | Houston | G11C 5/14 365/189.09 |
| 2009/0238023 A1 | | 9/2009 | Chen et al. | |
| 2009/0251984 A1 * | | 10/2009 | Jung | G11C 11/412 365/226 |
| 2010/0039854 A1 * | | 2/2010 | Anderson | G11C 11/412 365/156 |
| 2010/0309736 A1 * | | 12/2010 | Russell | G11C 11/413 365/189.011 |
| 2010/0322027 A1 * | | 12/2010 | Russell | G11C 5/145 365/227 |
| 2011/0103137 A1 * | | 5/2011 | Beat | G11C 11/412 365/156 |

FOREIGN PATENT DOCUMENTS

| | | |
|---|---|---|
| JP | H103790 A | 1/1998 |
| JP | H10188570 A | 7/1998 |
| JP | 2004206745 A | 7/2004 |
| JP | 2004259352 A | 9/2004 |

OTHER PUBLICATIONS

Lien C et al. (Derwent-Acc-No. 2001-463534 which is Patent-Family of U.S. Pat. No. 6,205,049).*

International Search Report and Written Opinion—PCT/US2011/029970, ISA/EPO—Jul. 5, 2011.

* cited by examiner

Conventional 6T SRAM

| SRAM cell structure | | Exemplary 5T SRAM | 6T SRAM of Arnaud |
|---|---|---|---|
| Stability Parameters | HSNM (with $V_{HOLD}$) | 5.93 σ | 5.93 σ |
| | RSNM | 5.66 σ | 6.62 σ |
| | WNM | 5.75 σ | 7.95 σ |
| Normalized Cell Area (design Rule in Arnaud) | | 0.89 | 1.00 |
| Normalized Dynamic Power | | 0.53 | 1.00 |
| Normalized Leakage Power | | 0.94 | 1.00 |
| Operating Time (ps) | Read | 807.4 | 893.6 |
| | Write "0" | 177.5 | 166.8 |
| | Write "1" | 183.8 | 166.8 |

LOW-POWER 5T SRAM WITH IMPROVED STABILITY AND REDUCED BITCELL SIZE

FIELD OF DISCLOSURE

Disclosed embodiments are directed to Static Random Access Memory (SRAM) cells. More particularly, exemplary embodiments are directed to low power, high stability and smaller layout size architectures of 5 Transistor (5T) SRAM cells.

BACKGROUND

SRAM is conventionally used in applications where speed and low power are considerations. SRAM cells are fast and do not need to be dynamically updated, as in the case of Dynamic Random Access Memory (DRAM) cells. The structure of a conventional SRAM cell comprises two cross-coupled inverters, conventionally formed from four Complementary Metal Oxide Semiconductor (CMOS) transistors. The cross-coupled inverters form the basic storage element, with two stable states which represent the complementary binary values "0" and "1". Two additional transistors, called "access transistors", serve to control access to the storage element during read and write operations. Accordingly, a conventional SRAM cell architecture involves six transistors, and is generally referred to as a 6T SRAM cell.

Figure 1:
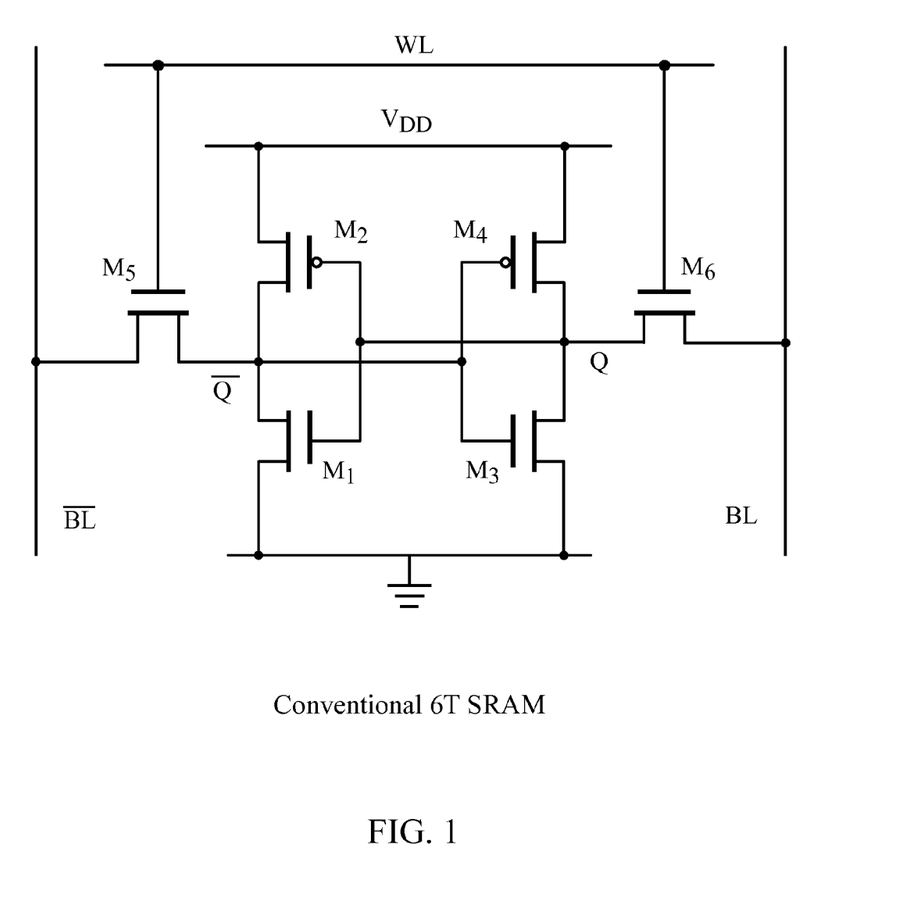
FIG. 1 illustrates a conventional 6T SRAM cell.

FIG. 1 illustrates a conventional 6T SRAM cell 100. The storage element comprises transistors M1-M4. A write operation on cell 100 is initiating by driving word line WL to positive power supply voltage VDD. Access transistors M5 and M6 write the values on complementary bit lines into the storage element. In a read operation, the complementary bit lines are both pre-charged to a predefined value, which is conventionally VDD. Once the word line is activated, the complementary values stored in the storage element act to discharge one of the bit lines, while the other is maintained at the precharge voltage. Sense amplifiers (not shown) quickly drive the values on the discharged bit line to ground voltage VSS and the complementary bit line to VDD accordingly.

Due to process variation, the threshold voltage on access transistors M5 and M6 may be mismatched, which may lead to the value on one of the complementary nodes of the storage element not being transferred correctly to one of the complementary bit lines. In this scenario, it is possible that the value so withheld from being transferred, may drive the cross-coupled inverters to change their states to a spurious value. This problem is commonly referred to as read instability.

Similarly it is possible that a high threshold voltage on the access transistors may make it difficult to drive the values on the bit lines onto the storage element in a write operation. The writability of the SRAM cell is said to be low in such cases. It will be recognized that these and other problems are associated with conventional 6T SRAM architectures.

5T SRAM architectures have been explored in the past, in order to overcome some of the drawbacks associated with 6T SRAM structures. In general, 5T SRAM cells comprise a single bit line and an access transistor as opposed to the complementary bit line pair and two access transistors featured in 6T SRAM cells. For example, 5T SRAM structures have been presented in Hiep Tran, "*Demonstration of 5T SRAM and 6T dual-port RAM cell arrays*", IEEE symposium on VLSI circuits digest, 1996, pp. 68-69, (hereinafter, "Tran"), which is incorporated in its entirety herein.

Figure 2:
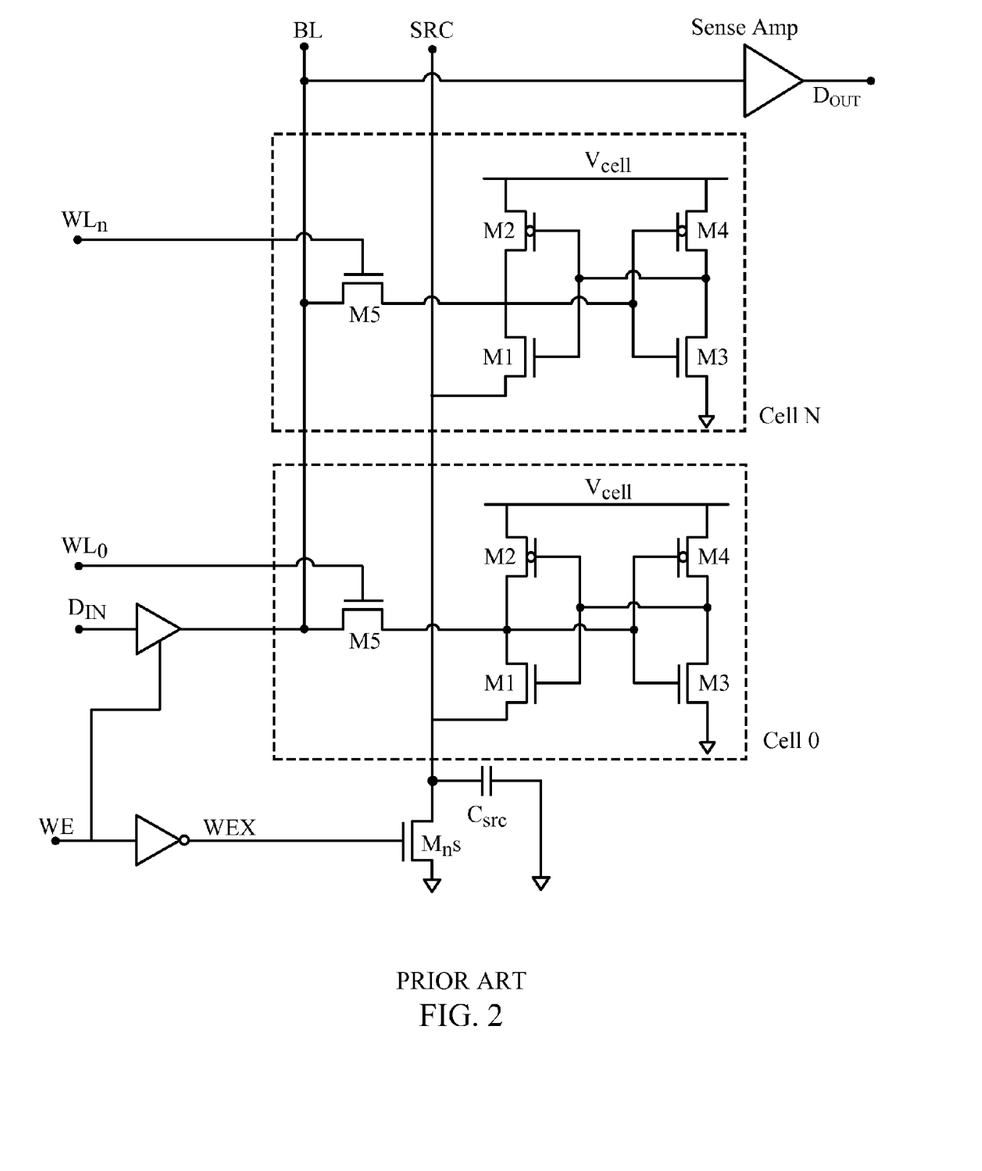
FIG. 2 illustrates a 5T SRAM circuit according to the reference Tran.

FIG. 2 illustrates a memory array according to Tran, comprising 5T SRAM cells. With reference to FIG. 2, a read operation is initiated by driving one of the word lines $WL_0$-$WL_n$ high (i.e., positive power supply voltage, VDD). Write enable WE is driven low (i.e., ground, VSS), which in turn drives WEX high, turning transistor $M_nS$ on. This causes the source terminal of transistor M1 to be driven low, via pass transistor $M_nS$. During a write operation, again, one of the word lines is high. In this case, write enable WE is high, and WEX is low, causing $M_nS$ to be turned off, and the source terminal of transistor M1 to be connected to capacitor $C_{src}$.

Based on the foregoing discussion, it will be appreciated that the SRAM circuit of Tran suffers from additional transistors (for example, $M_nS$ and the inverter for generating signal WEX), and capacitors ($C_{src}$) per column of the SRAM array. Since $C_{src}$ is connected to transistor M1 of all cells in the same column, the writability and stability of the storage element of the 5T SRAM are sensitive to the capacitance of $C_{src}$. Further, this additional capacitance causes degradation of write time to the cells, rendering the 5T SRAM circuit of Tran slower than conventional 6T SRAM structures.

Figure 3:
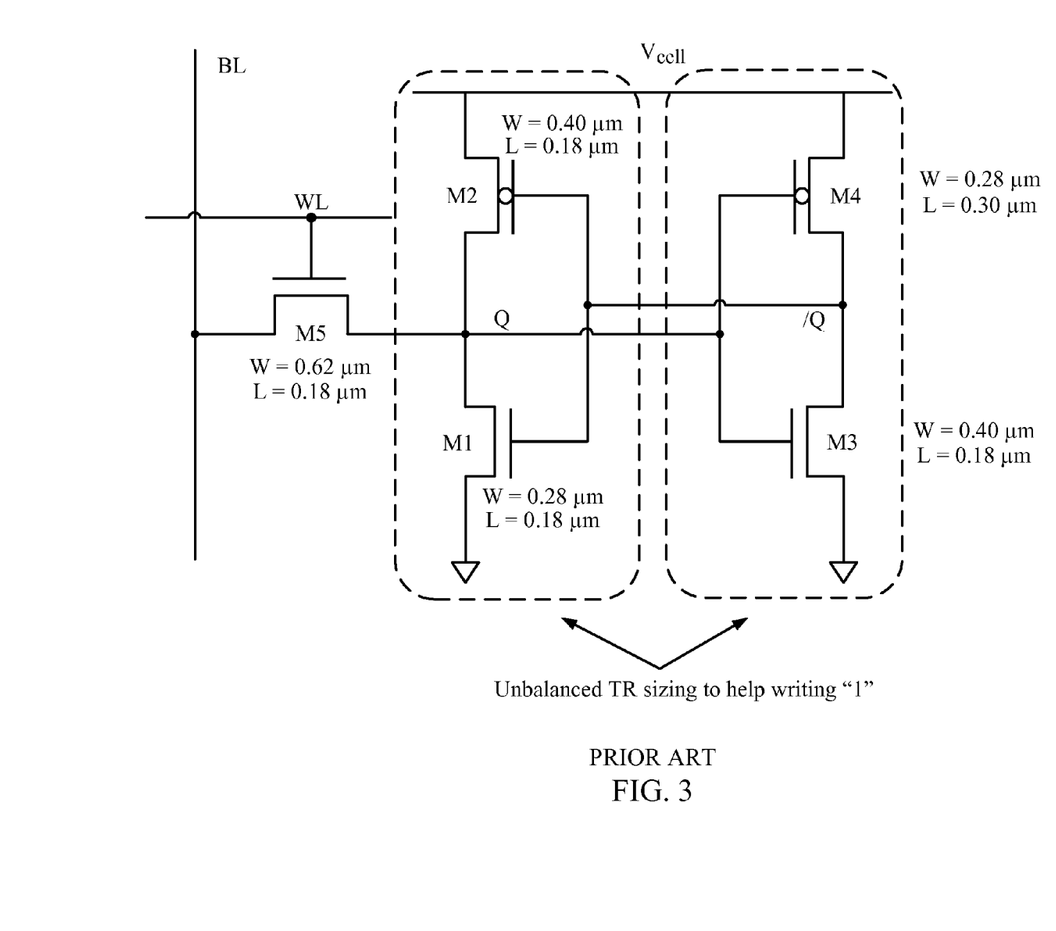
FIG. 3 illustrates a 5T SRAM circuit according to the reference Carlson.

Another reference directed to 5T SRAM structures is Ingvar Carlson et al., "*A high density, low leakage, 5T SRAM for embedded caches*" IEEE ESSCIRC, September 2004, pp. 215-218 (hereinafter, "Carlson"), which is incorporated by reference in its entirety, herein. FIG. 3 illustrates the 5T SRAM structure proposed by Carlson in 180 nm technology. Carlson attempts to overcome problems of writeability and read instability by precharging bit line BL to a precharge voltage $V_{pc}$, wherein the value of $V_{pc}$ lies between the positive supply voltage and ground, VDD and VSS.

During a read operation, the cell voltage $V_{cell}$, and the word line voltage $V_{WL}$ are driven to VDD, and the bit line is maintained at $V_{pc}$. The value of $V_{pc}$ is such that, the bit line voltage is low enough not to cause contentions and spurious writes with the values stored in the storage element of the SRAM. A write operation of "0" into the storage element is achieved by driving the bit line voltage to VSS (while driving $V_{WL}$ and $V_{cell}$ to VDD, as in the case of a read operation). The strength of access transistor M5 is configured such that the value of "0" (corresponding to voltage VSS at the bit line) can be easily driven into the storage element.

However, a write operation of "1" needs special consideration in Carlson. While $V_{cell}$ and the word line voltage are at VDD, the bit line voltage is driven to VDD. In this case, the voltage that appears at node Q, as shown in FIG. 3 is VDD−$V_{th5}$, where $V_{th5}$ is the threshold voltage of access transistor M5. In order for a write operation of "1" to be successful, node Q is required to be driven all the way to VDD, in spite of the reduced voltage value of VDD−$V_{th5}$ which appears at the node. The transistors M1-M4 are resized as shown in FIG. 3, in order to overcome contention with the values stored in the cross-coupled inverters, and accomplish a write operation of "1". Unfortunately, such unbalanced sizing of the transistors is detrimental to ease of layout, and results in an increased layout size of the SRAM bitcell. In fact, the 5T SRAM of Carlson may result in a layout size that is larger than conventional 6T SRAM circuits because additional circuitry is required to generate $V_{pc}$ that is lower than VDD to avoid an invalid write of "1" during read operations. Further, as process variation increases with technology scaling, the 5T SRAM of Carlson is rendered highly unstable, because asymmetric and unbalanced inverters are highly vulnerable to threshold voltage mismatch in the respective transistors of the cross-coupled inverter.

Another drawback of Carlson is seen in the case of half selected cells. Half selected cells are SRAM cells, whose word line is selected, but bit line is unselected (bit line voltage is a floating VDD value). Conventionally, SRAM cells in columns of the memory array that do not contain a selected SRAM cell, are half selected. In half selected cells, if the transistor strength of access transistor M5 is high enough, a write of "1" may be forced into the storage element. The unbalanced transistor sizes of Carlson make the SRAM circuitry more susceptible to such invalid write operations.

As described previously, one of the expected benefits of 5T SRAMs over 6T SRAMs is a smaller layout size. However, due to additional capacitors and unbalanced transistor sizes, this benefit is not realized in Tran and Carlson. Moreover, these schemes suffer from read instability and low writeability. Accordingly there is a need in the art for 5T SRAM circuits with lower layout size than conventional 6T SRAM circuits and also improved read stability and writeability.

SUMMARY

Exemplary embodiments are directed to apparatuses and methods for 5T SRAM cells featuring low power, high stability and smaller layout size.

For example, exemplary embodiments are directed to an SRAM comprising a storage element for storing data, wherein the storage element is coupled to a first voltage and a ground voltage, an access transistor to access operations on the storage element, and control logic configured to generate a value of the first voltage for a write operation that is different from the value of the first voltage for a read operation.

Another exemplary embodiment is directed to a method of forming an SRAM comprising coupling a storage element for storing binary data value to a first voltage and a ground voltage, controlling access operations on the storage element with an access transistor, and generating a value of the first voltage for a write operation that is different from the value of the first voltage for a read operation.

Yet another exemplary embodiment is directed to an SRAM comprising storage means for storing data coupled to a first voltage and a ground voltage, access means for controlling access operations on the storage means, and control means to generate a value of the first voltage for a write operation that is different from the value of the first voltage for a read operation.

Another exemplary embodiment is directed to a method of forming an SRAM comprising step for coupling a storage element for storing binary data value to a first voltage and a ground voltage, step for controlling access operations on the storage element with an access transistor, and step for generating a value of the first voltage for a write operation that is different from the value of the first voltage for a read operation.

BRIEF DESCRIPTION OF THE DRAWINGS

The accompanying drawings are presented to aid in the description of the various embodiments and are provided solely for illustration of the embodiments and not limitation thereof.

DETAILED DESCRIPTION

Aspects of the invention are disclosed in the following description and related drawings directed to specific embodiments. Alternate embodiments may be devised without departing from the scope of the invention. Additionally, well-known elements will not be described in detail or will be omitted so as not to obscure the relevant details of the disclosed embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of various embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 4:
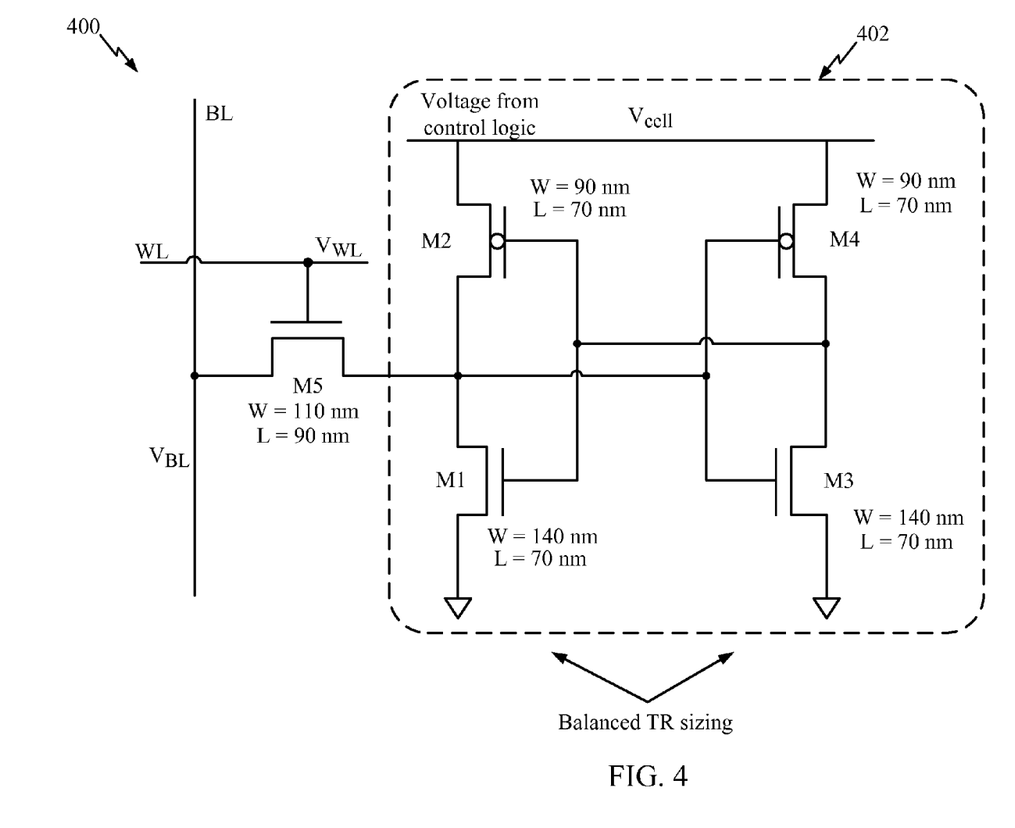
FIG. 4 illustrates a 5T SRAM cell according to an exemplary embodiment.

As described previously, prior art 5T SRAM circuits suffer from sensitive stability and slower write time due to $C_{src}$ and significantly low stability due to unbalanced transistor sizing in the storage element. Exemplary embodiments are directed to 5T SRAM circuits with balanced transistor sizing within the storage element, lowered cell voltage during write operation, and slightly increased access transistor size. FIG. 4 illustrates an exemplary 5T SRAM circuit with access transistor M5 and storage element 402 comprising transistors M1-M4. The transistor sizes of M1-M5 are as indicated in the figure. Transistor width (W) of access transistor M5 is larger than conventional access transistor size (W=110 nm in the embodiment of FIG. 4, as compared to conventional W=90 nm). The length (L) of transistor M5 is retained at a conventional value (L=90 nm). The transistor sizes of PMOS transistors M2 and M4 are balanced (W=90 nm, L=70 nm), and similarly, the transistor sizes of NMOS transistors M1 and M3 are balanced (W=140 nm, L=70 nm).

The 5T SRAM circuit 400 of FIG. 4 comprises three modes of operation: read, write and standby modes. The operation of circuit 400 will first be described in the read mode. The SRAM cell is selected by driving the word line voltage ($V_{WL}$ and $V_{cell}$ to VDD. The bit line voltage ($V_{BL}$) is held at a floating VDD. A voltage of VDD on the word line causes transistor M5 to be turned on, and because $V_{BL}$ is floating, the binary values held in the storage element can be read easily without contention. Accordingly, the possibility of a spurious write is also eliminated or substantially reduced in the read mode.

Figure 5:
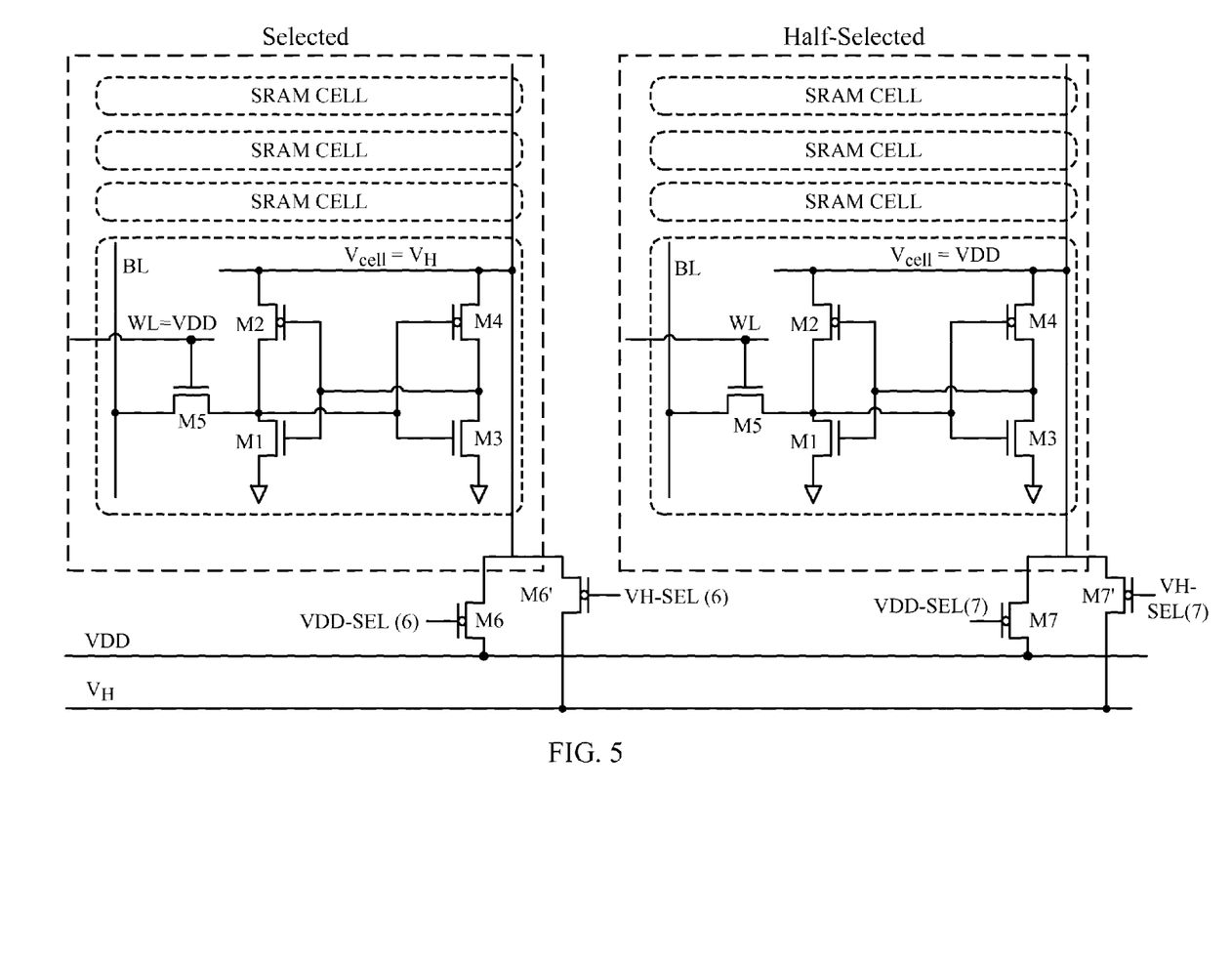
FIG. 5 illustrates a memory array comprising 5T SRAM cells according to an exemplary embodiment.

Next, the write mode will be described with reference to FIG. 5. PMOS transistors M6 and M6' are connected as shown to form cell voltage control logic in order to reduce the cell voltage Vcell to an intermediate voltage depicted as HOLD (VH) during a write operation. For example, M6 is connected to VDD when enabled by a VDD-SIL(6) signal (active low as illustrated) and M6' is connected to VHOLD during a write operation and is enabled by a VH-SEL(6) (active low as illustrated). However, it will be appreciated that the foregoing configuration is provided merely for illustration and should not be construed as limiting the control logic and/or voltage supply configuration for Vcell. Other control logic and/or voltage source configurations could be used to achieve the described functionality.

VHOLD can be configured to be less than VDD. Further, the value of VHOLD can be visible to all the cells connected to the selected bit line of the SRAM memory array. Accordingly, writeability of the SRAM cell can be improved. For example, in a write operation of "1" or "0", the bit line voltage $V_{BL}$ is driven accordingly, and the access transistor M5 enables a write to the storage element with the stored values, because the lowered cell voltage $V_{cell}$ (=VHOLD) causes the strength of the access transistor M5 to be greater than the strength of the storage element.

It will be appreciated that the SRAM cells in other columns of the memory array are not selected, and their bit lines are floating during a write operation on the selected SRAM cell. As described previously, these are half selected cells in the prior art circuits are susceptible to invalid writes. However, according to the various embodiments, such as illustrated in FIG. 5, the respective control circuits of the half selected cells can be configured to couple $V_{cell}$ to VDD. For example, as illustrated PMOS transistor M7 can be activated (e.g., VDD-SEL(7)) to supply voltage VDD as the cell voltage $V_{cell}$ of half selected cells. By this technique, the corresponding storage elements are supplied a higher cell voltage in the half selected cells, than in the selected cells. Since the bit line voltage, $V_{BL}$ of half selected cells is floating VDD, the storage elements are at a stronger voltage potential, thus preventing or reducing invalid writes caused by the floating bit line. Accordingly, exemplary embodiments mitigate the problem of invalid writes in half selected cells.

Once again, it will be appreciated that the foregoing configurations are provided merely for illustration and should not be construed as limiting the control logic and/or voltage supply configuration for $V_{cell}$. Further, the control signals (e.g., VH-SEL(x)) for activating the cell voltage control logic can be provided by any means that can achieve the functionality described herein.

The third mode of operation is the standby mode. In the standby mode, access transistor M5 is turned off by driving the word line voltage down to a ground voltage (VSS). The bit line voltage is maintained at the reduced voltage value, VHOLD. The cell voltage $V_{cell}$ is adjusted to VHOLD, using PMOS transistors such as M6' and M7'. In this mode, there is no read or write operation possible to the storage element. Further, because all switching activity is prevented in this mode, significant power savings can be achieved by maintaining the memory array in standby mode when there are no pending reads or writes.

Figure 6A:
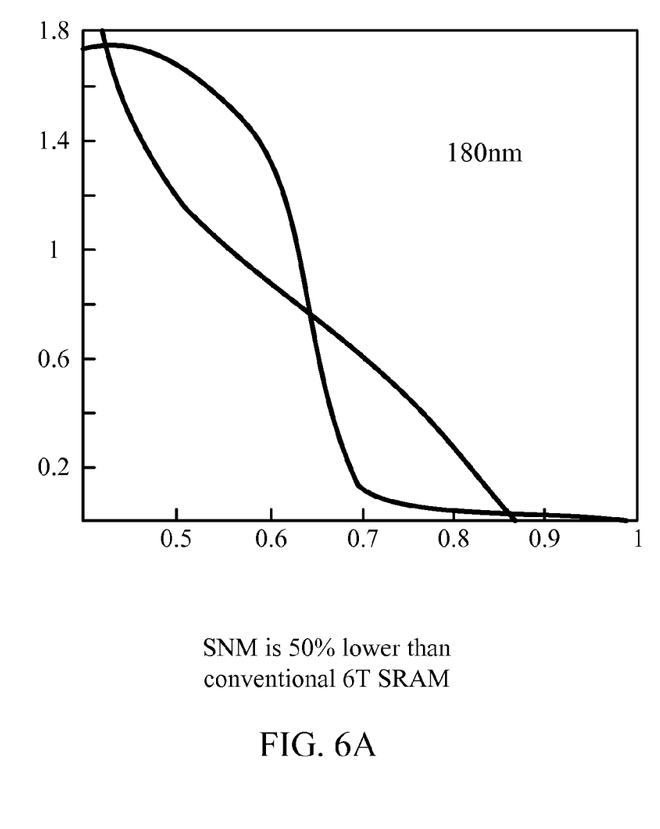
FIGS. 6A-B illustrate butterfly transfer curves (BTCs) of Static Noise Margin (SNM) of 5T SRAM cells according to the reference Carlson.
Figure 6B:
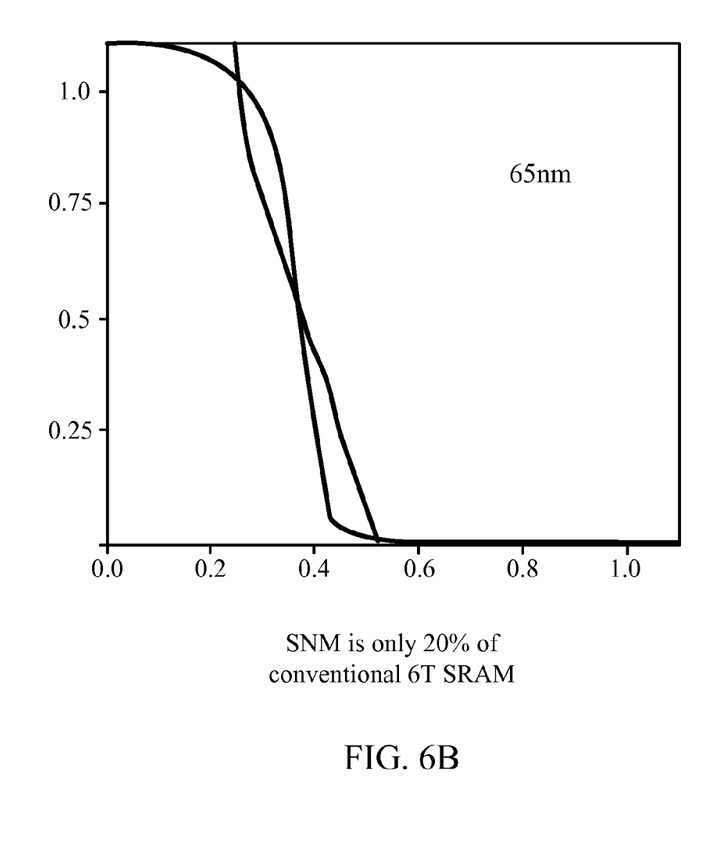

The stability of exemplary 5T SRAM circuits described above is evaluated in terms of a static noise margin (SNM). In general, SNM of an SRAM cell is the minimum DC noise voltage required to flip the state of the storage element. FIG. 6A illustrates a butterfly transfer curve (BTC) of the SNM of Carlson, for an 180 nm process. This BTC reveals that the SNM of Carlson's 5T SRAM is about 50% lower than that of a conventional 6T SRAM, which reflects poor stability. Moreover, the values significantly degrade as the technology scales down. Generating the BTC using a HSpice simulation of Carlson's circuit in 65 nm technology reveals the graph of FIG. 6B. As can be seen from FIG. 6B, the SNM of the 5T SRAM circuit is only about 20% of that of a conventional 6T SRAM. This indicates that the prior art 5T SRAM circuits are highly unstable.

FIGS. 7A-F illustrates the stability of exemplary embodiments in comparison to Carlson, wherein, σ (sigma) represents standard deviation. FIGS. 7A-C illustrate BTCs of SNMs in standby mode, Hold Static Noise Margin (HSNM), with a hold stability of 5.93σ; SNM in write mode, Write Static Noise Margin (WNM), with a write stability of 5.75σ; and in read mode, Read Static Noise Margin (RSNIM), with a read stability of 5.66σ, based on Monte Carlo simulations of 5T SRAM cells according to an exemplary embodiment. HSNM increases with the value of VHOLD. RSNM is proportional to the strength of pull down transistor M1 (see FIG. 4) divided by the strength of the access transistor M5. WNM is proportional to the strength of access transistor M5 divided by the strength of pull up transistor M2.

Figure 7:
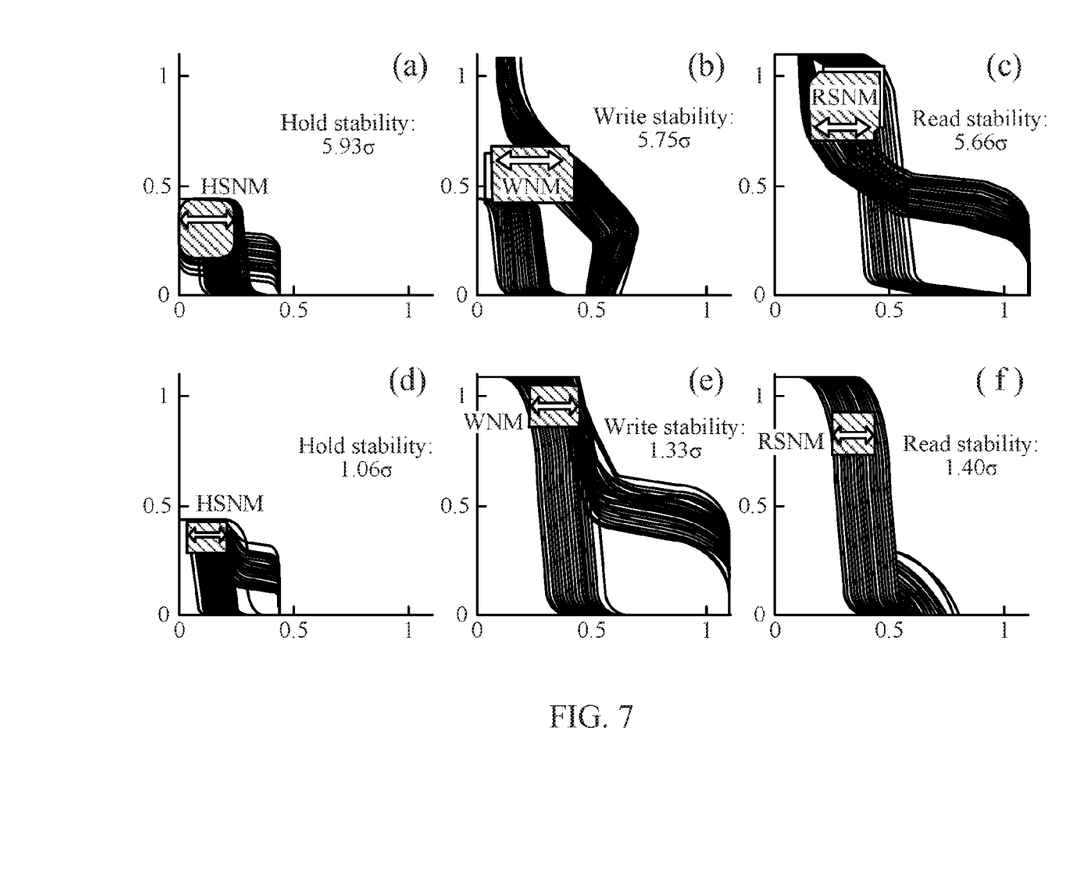
FIGS. 7A-F illustrate BTCs of SNMs in standby, write and read modes of operation based on Monte Carlo simulations of 5T SRAM cells according to an exemplary embodiment and according to the reference Carlson.

FIGS. 7 D-F illustrate the transfer curves of HSNM (with a hold stability of 1.06σ), WNM (with a write stability of 1.33σ) and RSNM (with a read stability of 1.40) based on Monte Carlo simulations for the 5T SRAM cell of Carlson, scaled to 65 nm technology. These comparative illustrations reveal that the scheme of Carlson is very susceptible to process variation, because of unbalanced transistor sizes, and exhibits very low stability in deep submicron technology.

Figure 8:
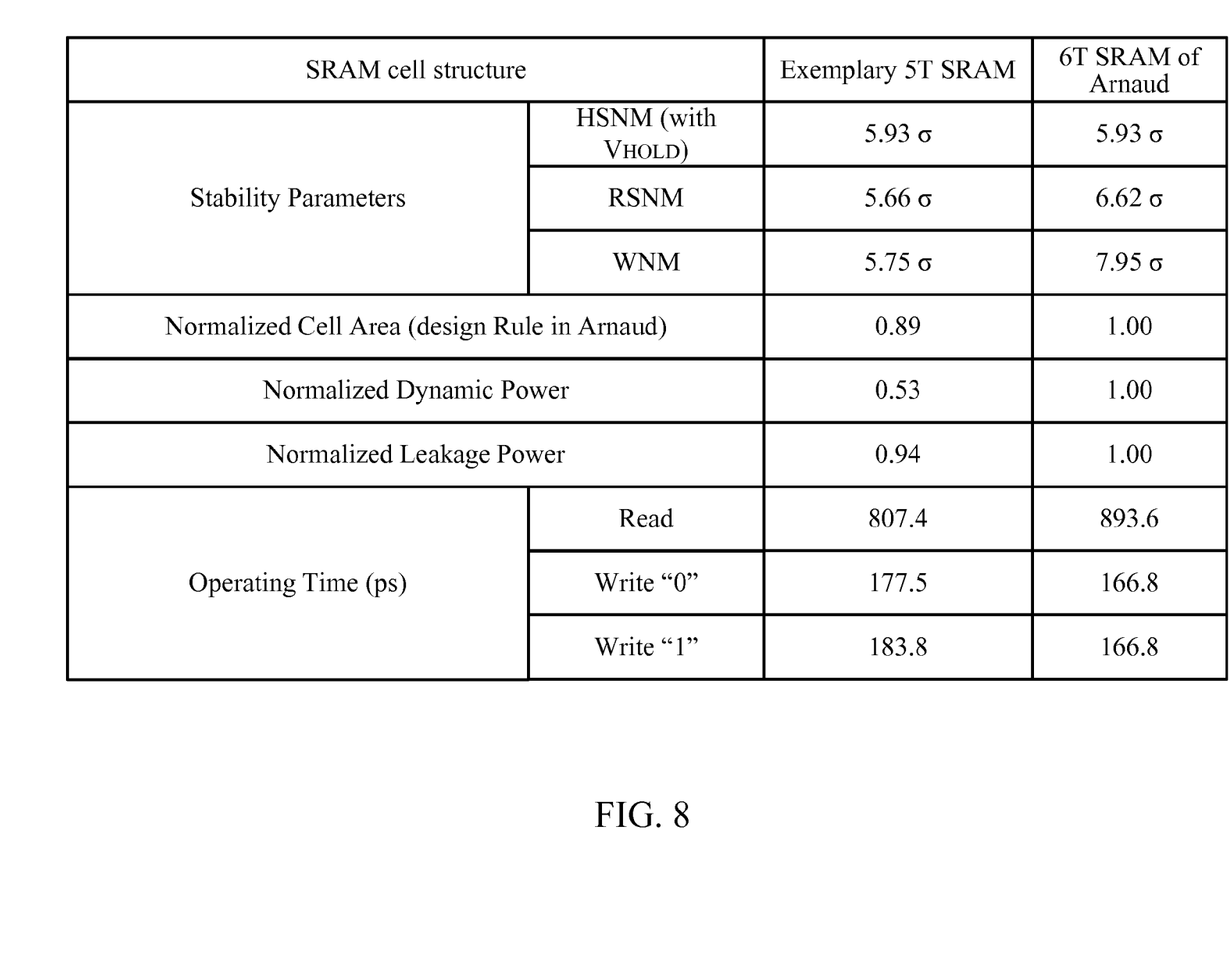
FIG. 8 illustrates a table providing comparisons of various parameters of exemplary embodiments and conventional 6T SRAMs.

The table of FIG. 8, wherein, σ (sigma) represents standard deviation, provides comparisons of various parameters of exemplary embodiments, with corresponding parameters of conventional 6T SRAM cells, described in Arnaud, et al., "*A Functional 0.69 µ² Embedded 6T-SRAM bit cell for 65 nm CMOS platform*." IEEE Symposium on VLSI Technology, 2003, pp. 65-66(hereinafter, "Arnaud"). Bitcell size, power consumption, and operating times of an exemplary 5T SRAM circuit are compared with the 6T SRAM circuit of Arnaud for 256 rows×256 columns array. As illustrated in FIG. 8, the size of the exemplary 5T bitcell is about 10% lower than the size of the 6T bitcell in Arnaud. On the other hand, since conventional 5T bitcells (such as the 5T SRAM of Carlson) have asymmetrical inner coupled inverters, the size of such conventional 5T bitcells are about 5% greater than the size of 6T bitcells. However, because the conventional 5T SRAMs cannot achieve proper yield due to significantly high probability of failure, they have not been considered for comparison of power consumption and operating times in FIG. 8

With continuing reference to FIG. 8, the 5T SRAMs according to exemplary embodiments have half the gate loading (single access transistor M5) for the word line WL compared to 6T SRAMs, during read and write operations. During a read operation, one of the two bit lines of selected cells in 6T SRAM arrays is always discharged to "0," but on the other hand, the bit line BL of selected cells in the exemplary 5T SRAM arrays is discharged only if the stored binary data value is '0'. Accordingly, exemplary 5T SRAMs can achieve around 47.1% power savings compared to 6T SRAMs during read operations.

During write operations, one of the two bit lines of selected cells in the 6T SRAM array is always driven to "0," but on the other hand, bit line BL of selected cells in the exemplary 5T SRAM arrays is driven to "0" only during a write of "0". However, additional VCELL toggling power is required for cells connected to the selected bit line BL in exemplary embodiments. Taking the additional VCELL toggling power into account, the exemplary 5T SRAM can achieve on the order of 46.9% power savings compared to 6T SRAMs.

In hold or standby mode, leakage power is the dominant factor in power consumption. Leakage current exists in the exemplary 5T SRAMs only if the stored binary data value is "0". However, leakage current in 6T SRAMs always exists, independent of the binary data value stored. Accordingly, the exemplary 5T SRAMs disclosed herein achieve around 6% leakage power savings, compared to 6T SRAMs.

Further, read times for exemplary 5T SRAMs are around 10% lower than read times for 6T SRAMs since the strength of the access transistor M5 of exemplary 5T SRAM bitcells is increased to improve WNM as described above. Write times of exemplary 5T SRAM bitcells are about 10% longer than write times of 6T SRAMs. However, the longer write times may not affect performance of exemplary 5T SRAM bitcells because operating times of bitcells are conventionally limited by read times.

Accordingly in view of the foregoing disclosure, it will be appreciated that an embodiment includes a Static Random Access Memory (SRAM) comprising a storage element (e.g., 402, FIG. 4) for storing data, wherein the storage element is coupled to a first voltage (Vcell) and a ground voltage (e.g., Vss). The SRAM further includes an access transistor (e.g., M5) to access operations on the storage element. The SRAM further includes control logic (e.g., M6, M6', FIG. 5) configured to generate a value of the first voltage for a write operation that is different from the value of the first voltage for a read operation.

Figure 9:
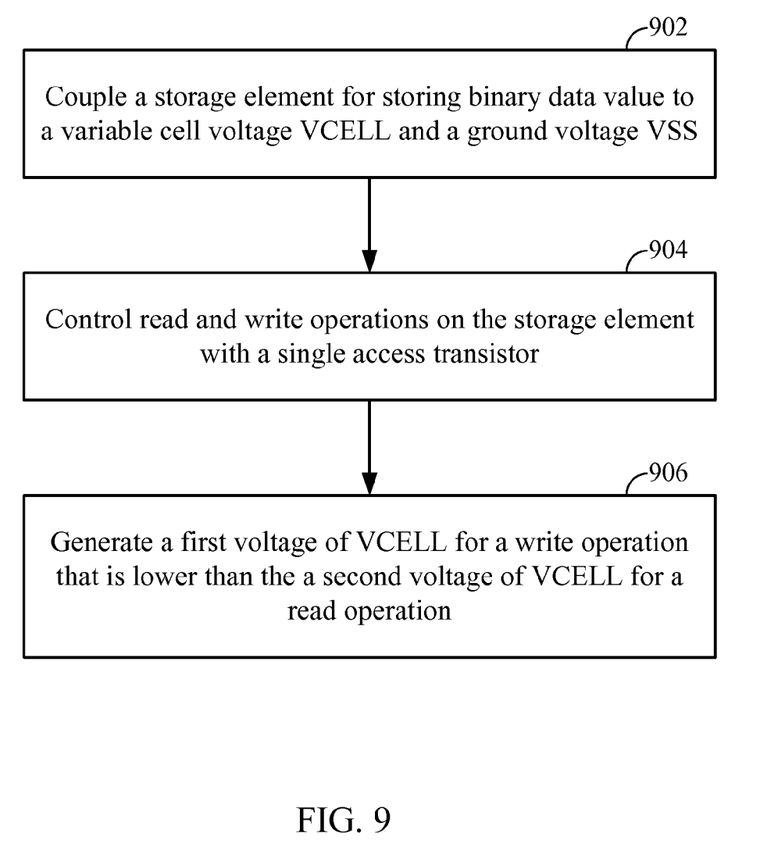
FIG. 9 illustrates a method of forming a 5T SRAM cell according to an exemplary embodiment.

It will be appreciated that embodiments include various methods for performing the processes, functions and/or algorithms disclosed herein. For example, as illustrated in FIG. 9, an embodiment can include a method of forming a 5T SRAM cell by coupling a storage element for storing binary data value to a first voltage (e.g., variable cell voltage VCELL) and a ground voltage VSS (block 902), controlling read and write operations on the storage element with a single access transistor (block 904) and configuring control logic to generate a value of VCELL for a read operation that is higher than the value of VCELL for a write operation (block 906).

Accordingly, exemplary embodiments advantageously provide smaller layout sizes as compared to prior art 5T and 6T SRAM circuits. Aspects of the various embodiments are also directed to significantly improved read stability and writeability compared to Carlson. By eliminating one access transistor as compared to 6T SRAM structures, the static power of disclosed 5T SRAM circuits is lower. As described previously, the dynamic power of disclosed embodiments is also significantly low, due to reduced cell size and elimination of one bit line and one access transistor as compared to 6T SRAM cells.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment can include a computer readable media embodying a method for forming low power 5T SRAM circuits with high read stability and easy writeability. Accordingly, the various embodiments are not limited to illustrated examples and any means for performing the functionality described herein are included in the various embodiments.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the disclosed embodiments may be described or claimed in the singular, the plural is contemplated unless limitation to the singular is explicitly stated.

What is claimed is:

1. A Static Random Access Memory (SRAM) comprising:
    a storage element to store data, wherein the storage element is coupled to a first voltage and a ground voltage, and wherein the storage element comprises a first inverter cross coupled to a second inverter, such that the first inverter and the second inverter are balanced in size;
    at most one access transistor to control access operations on the storage element, the access transistor coupled to a word line and a bit line, wherein a length dimension of the access transistor is greater than length dimensions of each transistor of the first inverter and the second inverter,
    wherein the first inverter comprises a first pull up transistor and a first pull down transistor; and
    control logic configured to generate a value of the first voltage for a write operation that is different from the value of the first voltage for a read operation, and
    wherein if the SRAM is selected for the write operation, the first voltage is driven to an intermediate voltage between a supply voltage and the ground voltage,
    if the SRAM is half-selected for the write operation, the first voltage is driven to the supply voltage and the bit line is floated, and
    during a standby mode of operation, the first voltage is driven to the intermediate voltage.

2. The SRAM of claim 1, wherein the value of the first voltage for a write operation is lower than the value of the first voltage for a read operation.

3. The SRAM of claim 1, wherein the access transistor is turned on by driving the word line to the supply voltage, and turned off by driving the word line to the ground voltage.

4. The SRAM of claim 3, wherein during a read operation, the word line is driven to the supply voltage, the bit line is floating and the first voltage is driven to the supply voltage.

5. The SRAM of claim 3, wherein the control logic comprises a first p-channel transistor coupled to the supply voltage and a second p-channel transistor coupled to the intermediate voltage such that during the write operation, the word line is driven to the supply voltage and the bit line is driven to a voltage value corresponding to the data to be stored.

6. The SRAM of claim 5, wherein during the standby mode of operation, the word line is driven to the ground voltage, and the bit line is driven to the intermediate voltage.

7. The SRAM of claim 5, wherein a hold static noise margin (HSNM) of the SRAM is proportional to the intermediate voltage.

8. The SRAM of claim 1, wherein the first inverter comprises a first p-channel transistor and a first n-channel transistor, and the second inverter comprises a second p-channel transistor and a second n-channel transistor, and wherein a size of the first p-channel transistor is equal to a size of the second p-channel transistor, and a size of the first n-channel transistor is equal to a size of the second n-channel transistor.

9. The SRAM of claim 1, wherein a size of the access transistor is correspondingly increased to improve a write noise margin parameter associated with the balanced sizes of the first inverter and the second inverter.

10. The SRAM of claim 1 integrated in at least one semiconductor die.

11. The SRAM claim 1, further comprising a device, selected from the group consisting of a set top box, music player, video player, entertainment unit, navigation device, communications device, personal digital assistant (PDA), fixed location data unit, and a computer, into which the SRAM is integrated.

12. A method in a Static Random Access Memory (SRAM) comprising:
    coupling a storage element for storing binary data to a first voltage and a ground voltage, wherein the storage element comprises a first inverter cross coupled to a second inverter, such that the first inverter and the second inverter are balanced in size;
    controlling access operations on the storage element with at most one access transistor wherein the access transistor is coupled to a word line and a bit line, and wherein a length dimension of the access transistor is greater than length dimensions of each transistor of the first inverter and the second inverter,
    wherein the first inverter comprises a first pull up transistor and a first pull down transistor; and
    generating a first voltage value of the first voltage for a write operation that is different from a value of the first voltage for a read operation,
    wherein if the SRAM is selected for the write operation, driving the first voltage to an intermediate voltage between a supply voltage and the ground voltage,
    if the SRAM is half-selected for the write operation, driving the first voltage to the supply voltage and floating the bit line, and
    during a standby mode of operation, driving the first voltage to the intermediate voltage.

13. The method of claim 12, wherein the value of the first voltage for a write operation is lower than the value of the first voltage for a read operation.

14. The method of claim 12 further comprising:
    activating the access transistor to couple the storage element to a bit line voltage during the read and write operations, wherein a gate of the access transistor is coupled to the word line.

15. The method of claim 14, during a read operation, further comprising:
    driving the word line to the supply voltage;
    floating the bit line; and
    driving the first voltage to the supply voltage.

16. The method of claim 14, further comprising: coupling a first p-channel transistor to the supply voltage and coupling a second p-channel transistor to the intermediate voltage, and wherein during the write operation, driving the word line to the supply voltage and driving the bit line to a voltage value corresponding to the data to be stored.

17. The method of claim 16, further comprising during the standby mode of operation, driving the word line to the ground voltage, and driving the bit line to the intermediate voltage.

18. A Static Random Access Memory (SRAM) comprising:
    storage means for storing data coupled to a first voltage and a ground voltage, wherein the storage means comprises a first inverter means cross coupled to a second inverter means, such that the first inverter means and the second inverter means are symmetrical and balanced in size;

access means comprising at most one access point to the storage means for controlling access operations on the storage means, the access means coupled to a word line and a bit line, wherein a length dimension of the access means is greater than length dimensions of each transistor of the first inverter means and the second inverter means, wherein the first inverter means comprises a first pull up transistor and a first pull down transistor; and control means to generate a value of the first voltage for a write operation that is different from the value of the first voltage for a read operation, wherein if the SRAM is selected for the write operation, the first voltage is driven to an intermediate voltage between a supply voltage and the ground voltage, if the SRAM is half-selected for the write operation, the first voltage is driven to the supply voltage and the bit line is floated, and during a standby mode of operation, the first voltage is driven to the intermediate voltage.

19. The SRAM of claim 18, wherein the value of the first voltage for a write operation is lower than the value of the first voltage for a read operation.

20. The SRAM of claim 18, wherein the control means is configured to generate the intermediate voltage.

21. The SRAM of claim 20, wherein during a read operation, the access means is turned on and coupled to a floating voltage, and the first voltage is driven to the supply voltage.

22. The SRAM of claim 20, wherein during the write operation, the access means is turned on and coupled to a voltage value corresponding to the data to be stored.

23. The SRAM of claim 20, wherein during a standby mode of operation, the access means is turned off and coupled to the intermediate voltage.

24. The SRAM of claim 18, wherein the access means is adjusted to improve a write noise margin parameter associated with the balanced sizes of the first inverter means and the second inverter means.

25. The SRAM of claim 18, wherein the SRAM is integrated in at least one semiconductor die.

26. The SRAM of claim 18, further comprising a device, selected from the group consisting of a set top box, music player, video player, entertainment unit, navigation device, communications device, personal digital assistant (PDA), fixed location data unit, and a computer, into which the SRAM is integrated.

* * * * *